United States Patent [19]
Hong

[11] Patent Number: 5,824,597
[45] Date of Patent: Oct. 20, 1998

[54] METHOD OF FORMING CONTACT HOLE PLUG

[75] Inventor: Jeonge Hong, Cheongju-si, Rep. of Korea

[73] Assignee: LG Semicon Co., Ltd., Chungcheongbuk-do, Rep. of Korea

[21] Appl. No.: 929,372

[22] Filed: Sep. 15, 1997

Related U.S. Application Data

[63] Continuation of Ser. No. 631,513, Apr. 12, 1996, abandoned.

[30] Foreign Application Priority Data

Apr. 12, 1995 [KR] Rep. of Korea ............... 1995-8455

[51] Int. Cl.$^6$ ................................................. H01L 21/28
[52] U.S. Cl. .................. 438/625; 438/627; 438/637; 438/648; 438/661; 438/663
[58] Field of Search ................................. 438/625, 627, 438/657, 648, 660, 661, 663

[56] References Cited

U.S. PATENT DOCUMENTS

| | | | |
|---|---|---|---|
| 4,970,176 | 11/1990 | Tracy et al. ........................... | 437/188 |
| 5,252,177 | 10/1993 | Hong et al. ........................... | 156/643 |
| 5,266,521 | 11/1993 | Lee et al. ............................. | 437/190 |
| 5,272,101 | 12/1993 | Forouhi et al. ....................... | 437/192 |
| 5,312,775 | 5/1994 | Fujii et al. ............................. | 437/192 |
| 5,332,691 | 7/1994 | Kinoshita et al. ................... | 437/192 |
| 5,385,868 | 1/1995 | Chao et al. ........................... | 438/660 |
| 5,399,527 | 3/1995 | Tabara .................................. | 437/200 |
| 5,418,187 | 5/1995 | Miyanaga et al. ................... | 438/661 |
| 5,543,357 | 8/1996 | Yamada et al. ..................... | 437/192 |
| 5,552,341 | 9/1996 | Lee ....................................... | 437/194 |
| 5,561,084 | 10/1996 | Takoto .................................. | 437/192 |

OTHER PUBLICATIONS

Jawarani et al.; "Intermetallic Compound Formation in Ti/Al Alloy Thin Film Couples and Its Role in Electromigration Lifetimes"; J. Electrochem. Soc., vol. 141, No. 1,01,94; pp. 302–306, Jan. 1994.

Colgan et al.; "Thin–Film reactions of Al with Co. Cr, Mo, Ta, Ti, and W"; J. Mater. Res., vol. 4, No. 4 Jul./Aug. 89; pp. 815–820.

*Primary Examiner*—John Niebling
*Assistant Examiner*—Thomas G. Bilodeau
*Attorney, Agent, or Firm*—Loudermilk & Associates

[57] ABSTRACT

An improved contact hole plug and method are disclosed, the plug connecting a first conductive layer to a second conductive layer which is insulated from the first conductive layer. The contact hole plug may be formed using the steps of: (1) forming a first conductive layer consisting of a multi-layer metal (2) forming an inter-layer insulating film, and a contact hole therein; and (3) carrying out a rapid heat treatment which causes an alloy reaction in the multi-layer metal, and the resulting alloy expands to form a plug in the contact hole. The rapid heat treatment may be accomplished with a heat treatment furnace or a rapid thermal annealing (RTA) process at a temperature of 300°–600° C. for about 30 seconds (RTA) or 30 minutes (heating furnace).

26 Claims, 10 Drawing Sheets

METHOD OF FORMING CONTACT HOLE PLUG

This application is a continuation of application Ser. No. 08/631,513 filed on Apr. 12, 1996, now abandoned.

FIELD OF THE INVENTION

The present invention relates to an improved contact hole plug as well as a method of forming this contact hole plug in an insulating layer disposed between two conductive wiring layers. In particular this plug is formed from a conductive layer located at the bottom of the contact hole which expands during an alloy reaction thus filling and decreasing the aspect ratio of the contact hole. This simplifies the process of interconnecting two wiring layers.

BACKGROUND OF THE INVENTION

As the density of semiconductor devices increases, the demand for multi-layer wiring is also increased. At the same time, the lateral dimension of such devices is also reduced because of circuit design rules.

However, the thickness of an inter-metal dielectric (IMD) insulating layer located between two metal wiring layers is not varied at all. Therefore, the aspect ratio (the ratio of the height to the diameter of the hole) of a contact hole in this insulating layer (used to connect the two metal wiring layers) is increased. Therefore, step coverage defects and depth differences result when an metal interconnect layer is deposited into the contact hole for connecting to the metal wiring layer at the bottom of the contact hole. Consequently, malfunctions can occur because the contact hole cannot be completely filled with the interconnect metal, or because the contact plug is formed defectively.

The conventional method which is generally used for overcoming the above described problems is illustrated in FIGS. 1A–1E. As seen there, a CVD tungsten is deposited and then etched back, thereby forming a plug in the contact hole.

In the conventional method, as illustrated in FIG. 1A, inter-layer insulating film 11 is formed to insulate a later formed upper wiring layer (layer 17 in FIG. 1E) from a lower wiring layer 10. In order to connect to the lower wiring layer, inter-layer insulating film 11 is selectively etched to form contact hole 12. Next, in FIG. 1B, TiN/Ti layer 14 is formed as a barrier metal on the contact hole and on the inter-layer insulating film.

Then as illustrated in FIG. 1C, CVD tungsten layer 15 is deposited upon TiN/Ti layer 14. Thereafter, as shown in FIG. 1D, tungsten layer 15 is etched back, so that the tungsten remains only within the contact hole, thereby forming tungsten plug 16 within the contact hole. Then as shown in FIG. 1E, upper wiring layer 17 (which is composed of aluminum or the like) is deposited and patterned so as to form a wiring layer that is now electrically interconnected via plug 16 to lower wiring layer 10.

Another example of a conventional method is illustrated in FIGS. 2A–2E, and, in this method, a plug is formed by utilizing the flow of aluminum to fill a contact hole.

This conventional method is carried out in the following manner. That is, as seen in FIG. 2A, inter-layer insulating film 21 is formed to insulate a later formed upper wiring layer 27 (FIG. 2E) from a lower wiring layer which is formed on substrate 20. In order to connect with the lower conductive layer, inter-layer insulating film 21 is selectively etched, to form contact hole 22. Next, as seen in FIG. 2B, TiN/Ti layer 24 is formed on the contact hole and on the inter-layer insulating film.

In order to improve the adhesive strength of the aluminum layer, Ti layer 25 is formed as a glue layer on TiN/Ti layer 24 as illustrated in FIG. 2C. In FIG. 2D, an Al layer is deposited upon glue layer 25 at a low temperature of about 100° C. Then another Al layer is deposited at a high temperature of about 500° C. Under this condition, the aluminum flows and forms a layer filling contact hole 22. Then aluminum layer 27 is patterned to form wiring in this upper metal layer.

In the first conventional method described above, (where a tungsten plug is formed) a CVD tungsten is deposited and the tungsten is etched back. The process cost is high, and the productivity is low. In the second prior art method, where the contact hole is filled by utilizing the flow of aluminum, barrier layer 24 and glue layer 25 are deposited by sputtering when the aspect ratio of the contact hole is large. Therefore, an overhang effect occurs wherein the thickness of barrier metal layer 24 and glue layer 25 become thicker at the top of the contact hole than at the bottom portion. Further, when Al is deposited at a high temperature, Al reacts with Ti to form TiAl3, with the result that the flow of Al is impeded, and the contact hole is not completely filled. In particular, when TiAl3 is formed, a volume expansion of over three (3) times occurs in the material located at the Ti-Al interface. Therefore, as shown in FIG. 3, due to the TiAl3 which is formed on the upper portion of the contact hole, the diameter of the upper portion of the contact hole is reduced, with the result that the Al flow is inhibited. This makes the formation of the Al plug difficult, because the Al cannot completely fill the contact hole and maker a proper interconnection. This phenomenon is described in the following articles:

(1) E. G. Colgan and J. W. Meyer, "THIN FILM REACTIONS OF Al WITH Co, Cr, Ti, No, Ta, AND W", J. Mater. Res. Vol. 4, No. 4 pp. 815–819 (1989).

(2) H. Kawasaki, J. O. Olowolafe, C. C. Lee, J. Klein, and F. Pintchovski, "INTERMETALLIC COMPOUND FORMATION IN Ti/Al ALLOY THIN FILM COUPLES AND ITS ROLE IN ELECTROMIGRATION LIFETIME", J. Electrochem Soc., Vol. 141, No. 1, pp. 302–306 (1994).

SUMMARY OF THE INVENTION

The present invention is intended to overcome the disadvantages of the conventional techniques described above.

Therefore it is an object of the present invention to provide an improved contact hole plug, and to provide a method of forming this contact hole plug for cases where the aspect ratio of a contact hole may vary from relatively small to relatively large.

To accomplish this, the present invention first makes use of the fact that the volume of a conductive layer forming part of the plug, and located at the bottom of a contact hole expands during an rapid thermal anneal process, and thus fills the contact hole. This decreases the aspect ratio of the contact hole, and simplifies the interconnection process between two metal wiring layers.

In a first embodiment, when the aspect ratio of the contact hole is relatively small, the resulting plug formed from the expanding conductive layer substantially fills the entire contact hole and can be used directly for interconnecting two metal wiring layers. In this first embodiment, the conductive layer is formed from a tri-layer structure including a metal silicide layer, an aluminum layer, and a further metal silicide layer.

In a second embodiment, when the aspect ratio of the contact hole is relatively large, the resulting plug does not fill the entire contact hole, but does substantially reduce the aspect ratio of the hole so as to facilitate a further step involving a conventional prior art aluminum flow to complete the formation of the contact hole plug. In these two embodiments, the method of reducing the contact hole aspect ratio and forming the contact hole plug basically includes the steps of: (1) forming a first conductive layer consisting of a multi-level structure including aluminum and metal silicide (Msix - AlMSix) layers; (2) forming an inter-layer insulating film, and a contact hole in this film; and (3) carrying out a rapid heat treatment in the contact hole to cause a metal-Si-Al alloy reaction that results in a volume expansion of this material, thus filling the contact hole.

The rapid heat treatment is carried out in the form of the rapid thermal annealing (RTA) at a temperature of 300°–600° C. for about 30 seconds (RTA) or 30 minutes (heating furnace).

In the first and second embodiments, the metal for the metal silicide MSix layers is selected from a group consisting of Co, Cr, Mo, Ta, Ti and W.

In a third embodiment, the first conductive layer is made of a multi-level metal structure including a first metal layer, a metal nitride layer, an aluminum layer, and a second metal layer. An inter-layer insulating film is deposited on this conductive layer, and a contact hole is formed. A second conductive layer (Al) is then deposited on the inter-layer insulating film and in the contact hole over the first conductive layer. Then a heat treatment is carried out, so that an M-Al alloy compound is formed in the interface between the first and second layers in the inner portion of the contact hole, expanding and filling the hole and thereby forming a plug.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

A first embodiment of the present invention will be described with reference to FIGS. 4A–4D. This first embodiment is especially applicable in cases where the diameter of the contact via hole is large and the height of the hole is small (i.e., a case where the aspect ratio is relatively small).

Figure 1A:
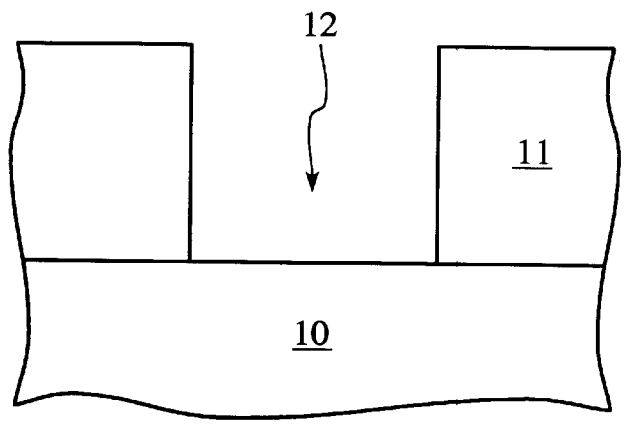
FIGS. 1A–1E are partial sectional views illustrating a conventional method for formation of a contact hole plug.
Figure 1B:
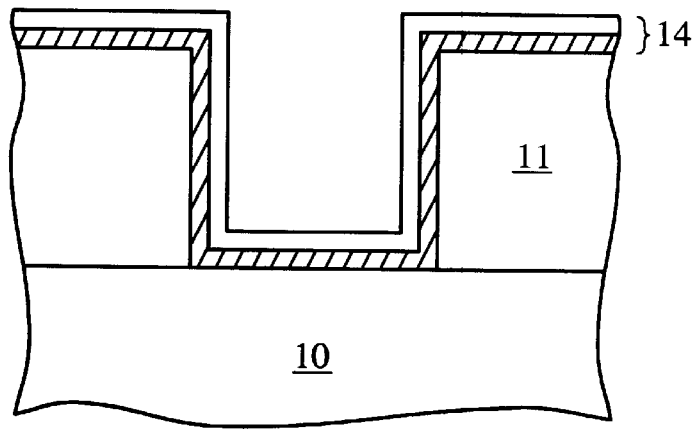
Figure 1C:
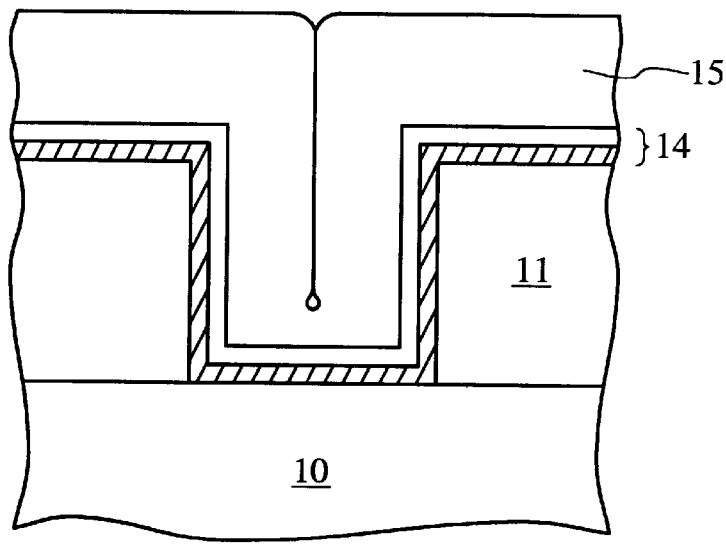
Figure 1D:
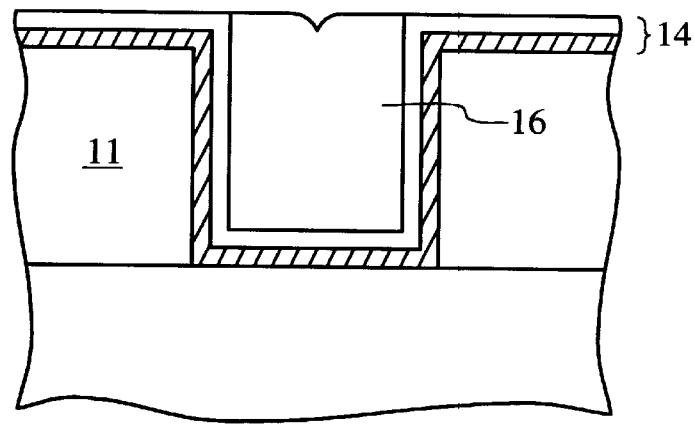
Figure 1E:
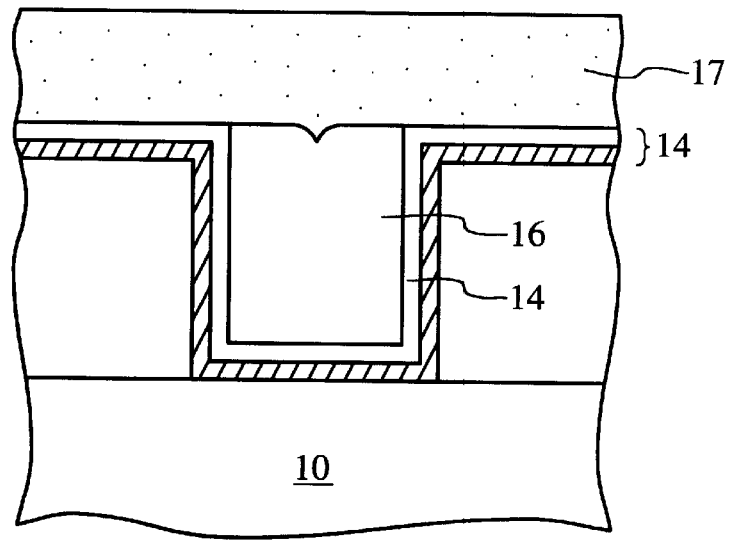
Figure 2A:
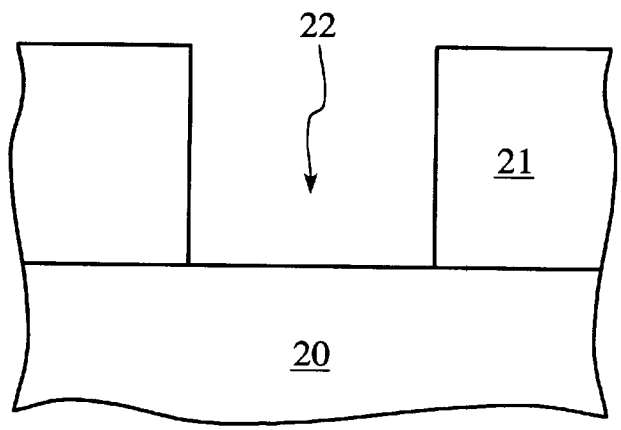
FIGS. 2A–2E are partial sectional views illustrating another conventional method for formation of a contact hole plug.
Figure 2B:
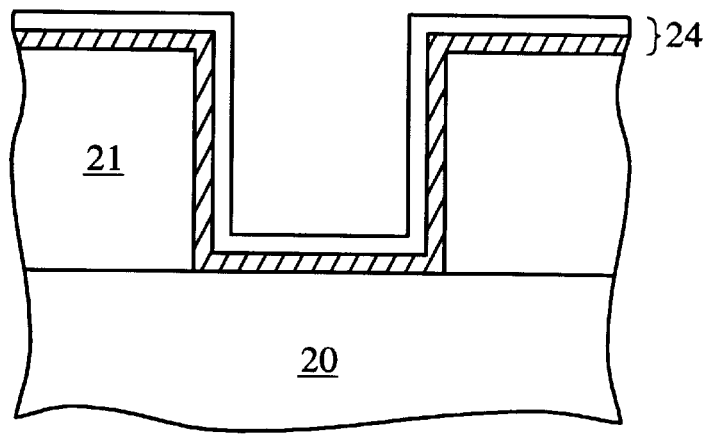
Figure 2C:
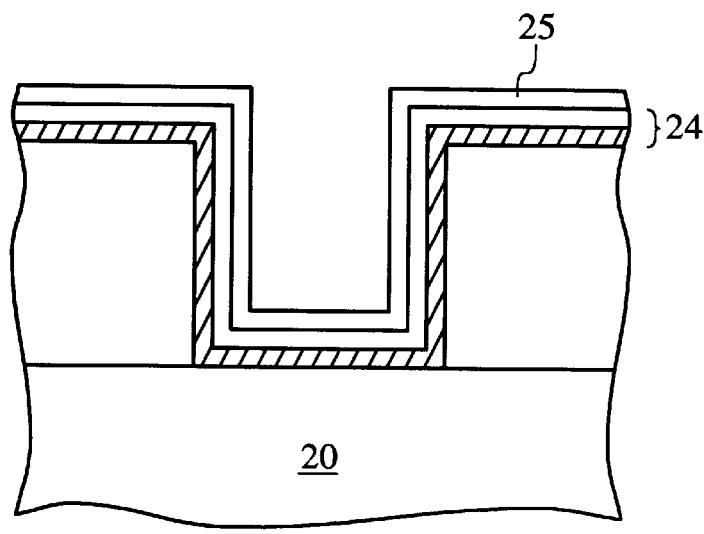
Figure 2D:
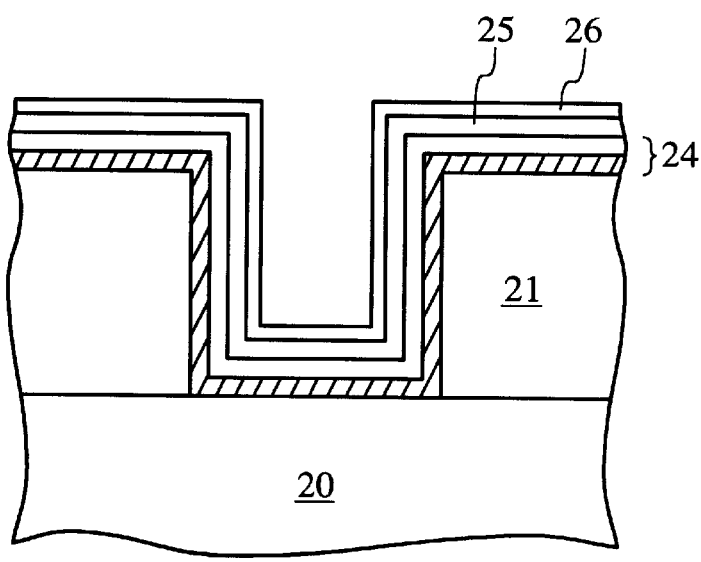
Figure 2E:
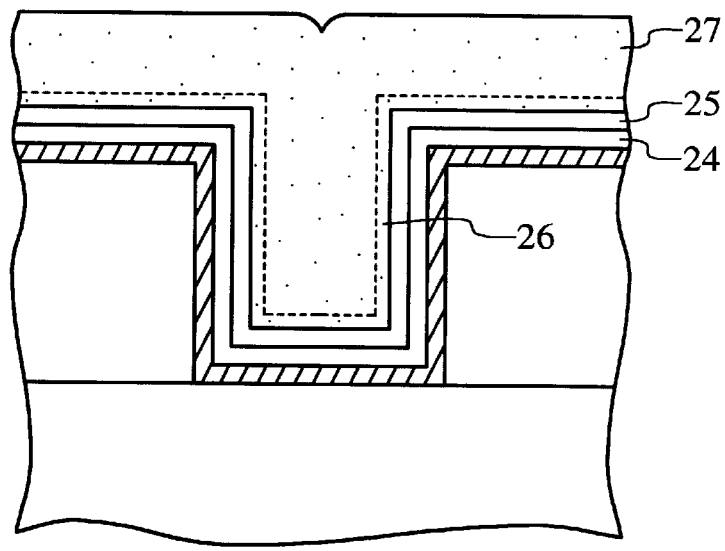
Figure 3:
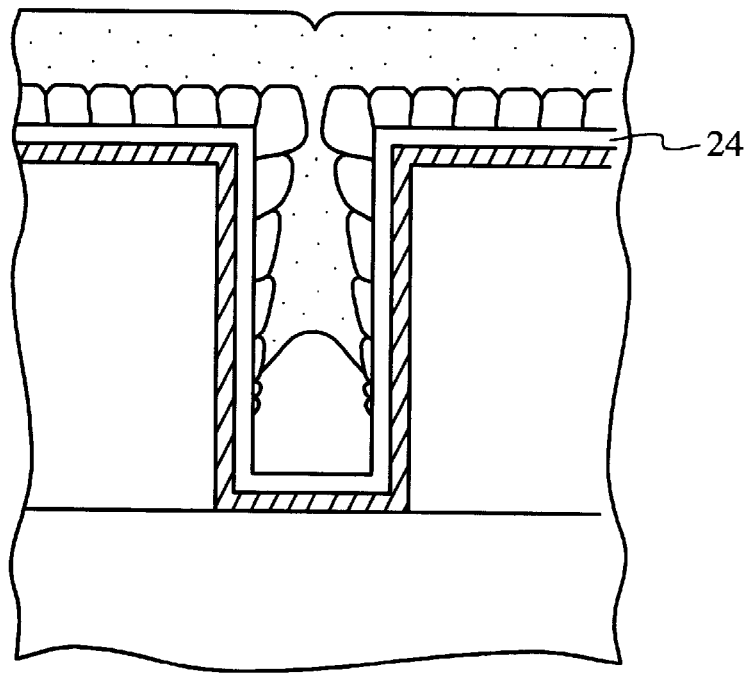
FIG. 3 is a partial sectional view illustrating the resulting defective contact hole plug resulting from use of conventional methods.
Figure 4A:
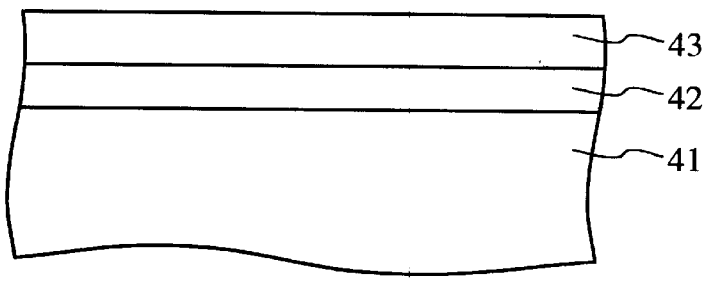
FIGS. 4A–4D are partial sectional views illustrating a first embodiment of the present invention.

First, as illustrated in FIG. 4A, a first insulating layer 42 such as an oxide layer is formed upon semiconductor substrate 41, and lower wiring layer 43 is formed on this first insulating layer 42. Lower wiring layer 43 is formed in the following manner. An MoSix layer is deposited in a thickness of about 400A, then an Al layer of about 5000A is deposited upon the MoSix, and then a 600A MoSix layer is deposited upon the Al layer. Layer 43 is patterned to form lower wiring layer 44. Lower wiring layer 44 thus consists of the tri-level metal layer structure consisting of MoSix (400A)/Al(5000A)/MoSix(600A), where the magnitude of x is x>2.0.

Figure 4B:
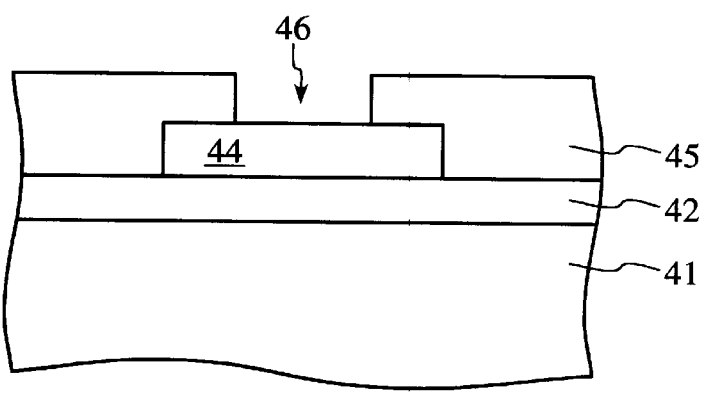

Then, as illustrated, in FIG. 4B, second insulating layer 45 composed of SiO2 is deposited on first insulating layer 42 and on lower wiring layer 44, and the second insulating layer which is disposed on lower wiring layer 44 is selectively etched to form contact hole 46.

Figure 4C:
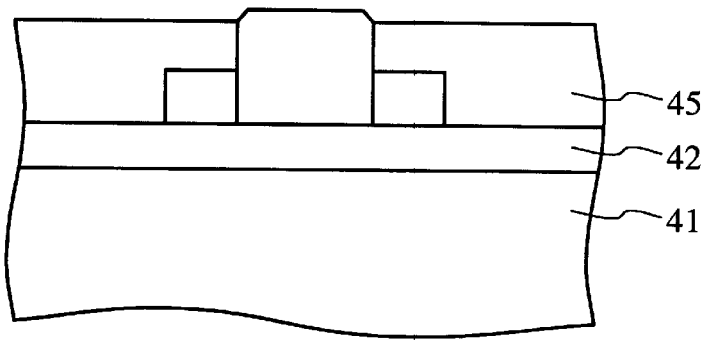

A rapid thermal annealing step is then carried out at a temperature of 300°–600° C. for several seconds to 1 minute, and preferably at a temperature of 400° C. for about 30 seconds. While the heat treatment is carried out, the exposed lower wiring layer 44 on the lower bottom portion of contact hole 46 undergoes an alloying reaction. As a result the volume of this layer is expanded, thereby filling a portion of the contact hole from the bottom up as illustrated in FIG. 4C.

Figure 5A:
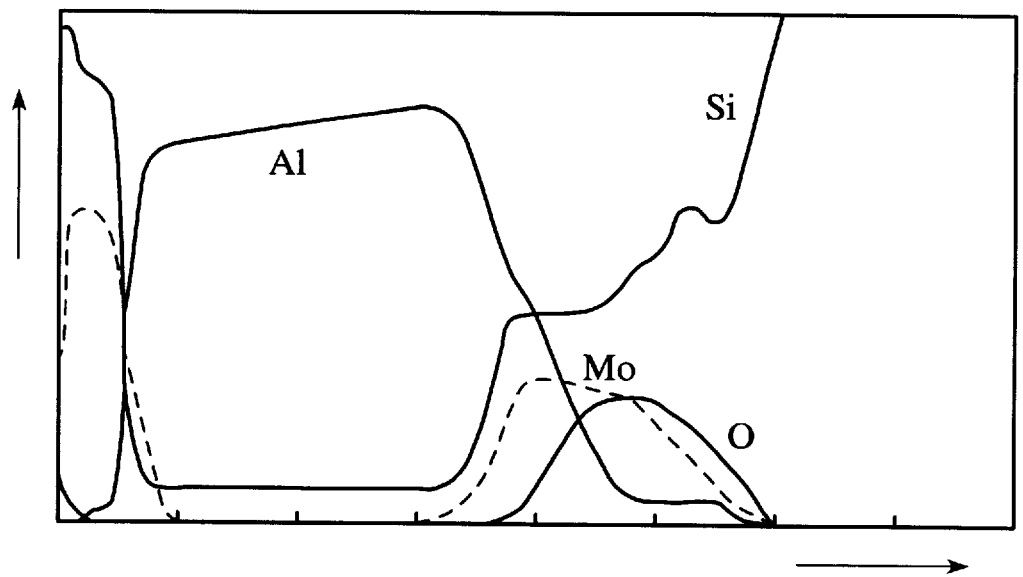
FIGS. 5A and 5B are graphs comparing the concentration of elements with depth in the lower conductive layer of the present invention before and after a rapid thermal anneal process.
Figure 5B:
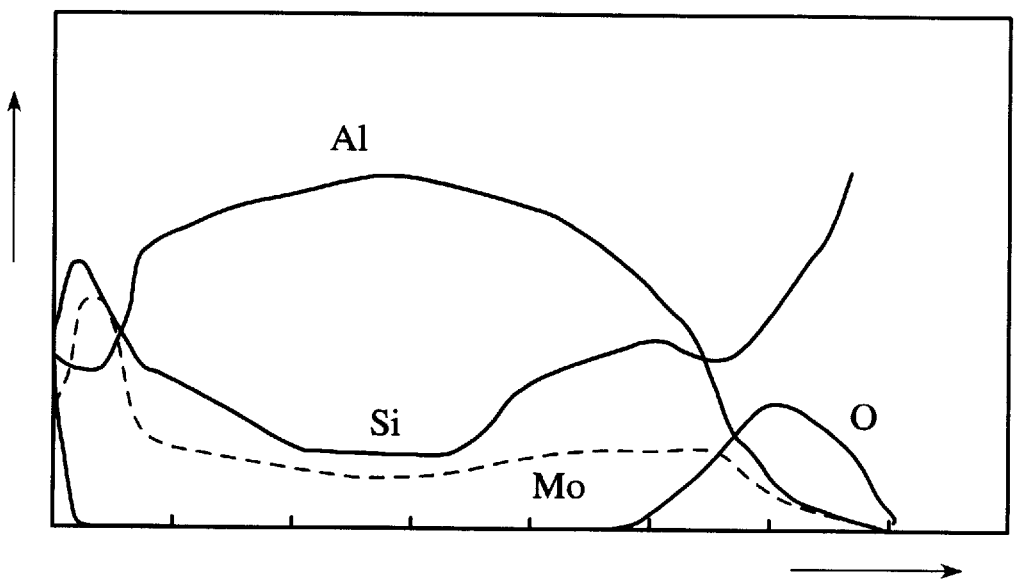

Evidence of the alloying process, including a graph of the element distributions versus depth in the lower layer 44 is illustrated in FIGS. 5A and 5B. In Fig. 5A concentrations of the elements in lower layer 44 (Al, Si, O and Mo) are plotted versus a distance within the lower layer 44 just after the depositions of 400A of MoSix, 5000A of Al and 600A of MoSix. Fig. 5B illustrates the concentrations of elements in this same layer 44 after the alloying reaction has taken place; i.e., after the rapid thermal annealing at a temperature of 400° C. for 30 seconds. According to this data, it can be seen that an alloy of MO-Si-Al is created in great quantities, and that the volume of this same layer 44 is greatly expanded.

Figure 6A:
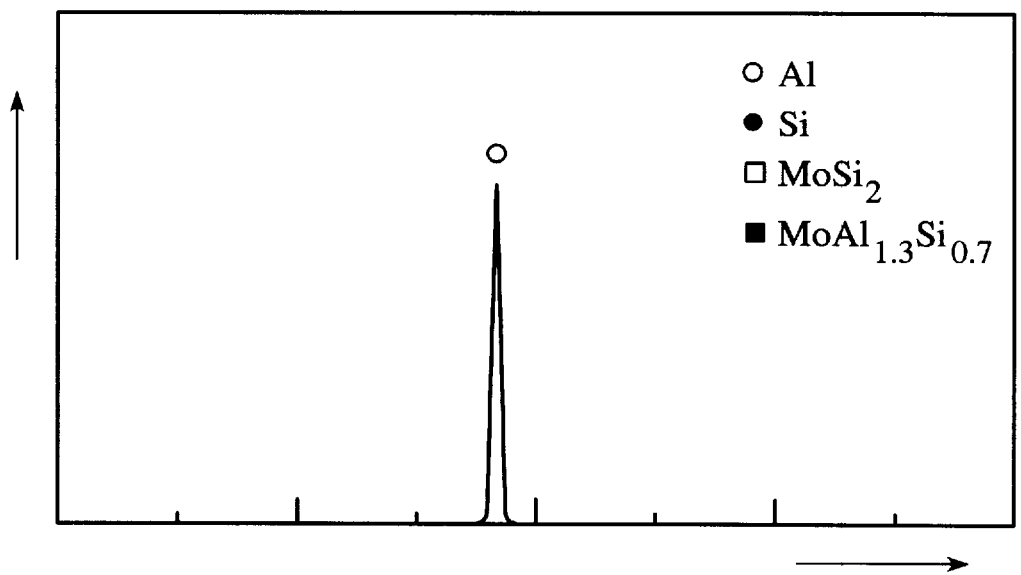
FIGS. 6A and 6B are X-ray spectrum graphs of the concentration of elements with depth in the lower conductive layer of the present invention before and after a rapid thermal anneal process.
Figure 6B:
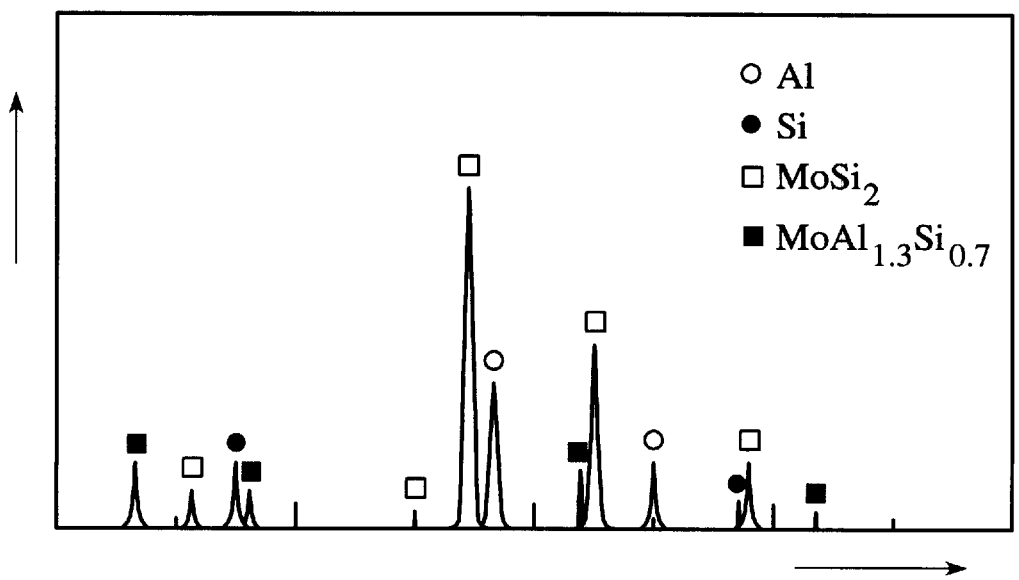

FIGS. 6A–6B illustrate the X-ray spectra of the aluminum layer forming part of the tri-metal layer structure in lower layer 44. Specifically, FIG. 6A graphs observed data concerning the element spectra of the Al layer within lower layer 44 just after the deposition of 400A of MoSix, 5000A of Al and 600A of MoSix. It can be seen here that there exists only Al in this layer at this time. FIG. 6B illustrates a state just after the rapid thermal annealing step has been carried out at 400° C. for about 30 seconds. In this state, it can be seen now that an Mo-Si-Al alloy is created in large quantities, and that an MoAl-1.3Si-0.7 alloy occupies the greatest volume within the layer which previously only contained Al; moreover, Al, Si and MoSi2 are also evenly distributed.

This alloy reaction phenomenon can be explained in the following manner. The silicide layers (MoSix) which are disposed upon and under the Al layer provide Si atoms, so that the Si atoms react with Al atoms during the RTA process to form eutectic compounds. Under this condition, the refractory metals participate in the reactions, thereby expanding the volume of this layer, filling the contact hole and thus forming the plug.

Figure 4D:
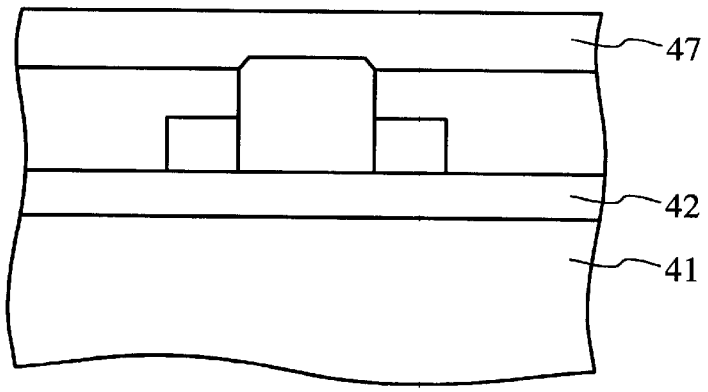

Then, as illustrated, FIG. 4D, an upper wiring layer 47 is formed over the contact hole and the contact plug by depositing and patterning an aluminum layer.

FIGS. 7a–7D illustrate a second embodiment of the present invention. This second embodiment is particularly applicable in cases where the diameter of the contact hole is relatively small and the depth of the contact hole is relatively large, i.e., the case where the aspect ratio is relatively large. In this case, the present invention can be used to reduce the aspect ratio of the contact hole through the alloy reaction in the lower layer.

The method of forming this contact hole plug for the case of large aspect ratio contact holes (as required in a VLSI device) will be described with reference to FIGS. 7A–7D.

Figure 7A:
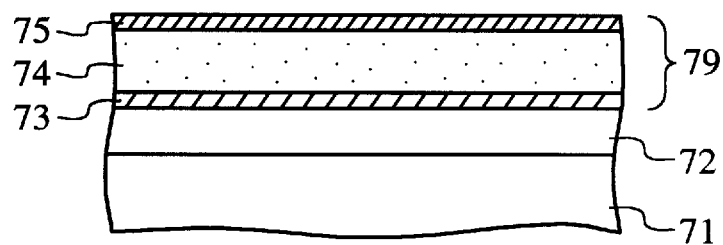
FIGS. 7A–7D are partial sectional views illustrating a second embodiment of the present invention.

First as illustrated in FIG. 7A, first insulating layer 72 is formed upon substrate 71, and 79 is formed thereupon. Lower wiring layer 79 is formed in the following manner. MoSix layer 73 is formed in a thickness of 400A, and thereupon, a 5000A layer of Al layer 74 is formed; finally, a 600A layer of MoSix layer 75 is formed thereon where the magnitude of x is x>2.0.

Figure 7B:
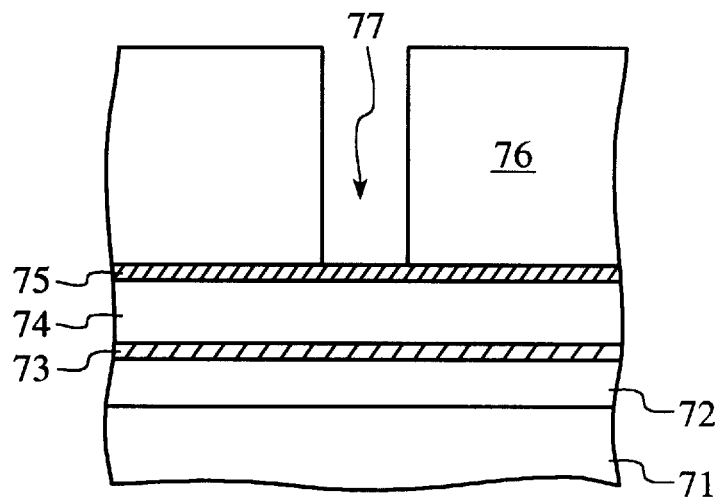

As illustrated in FIG. 7B, second insulating layer 76 composed of an oxide is formed on lower wiring layer 79. This second insulating layer 76 is etched to form contact hole 77.

Figure 7C:
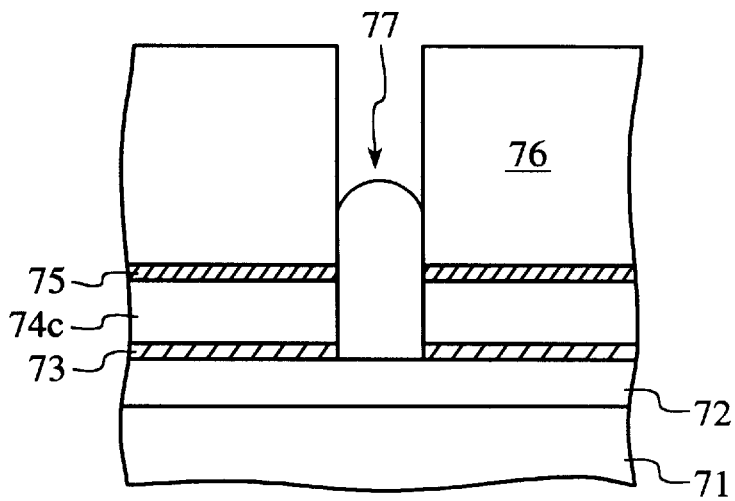
Figure 7D:
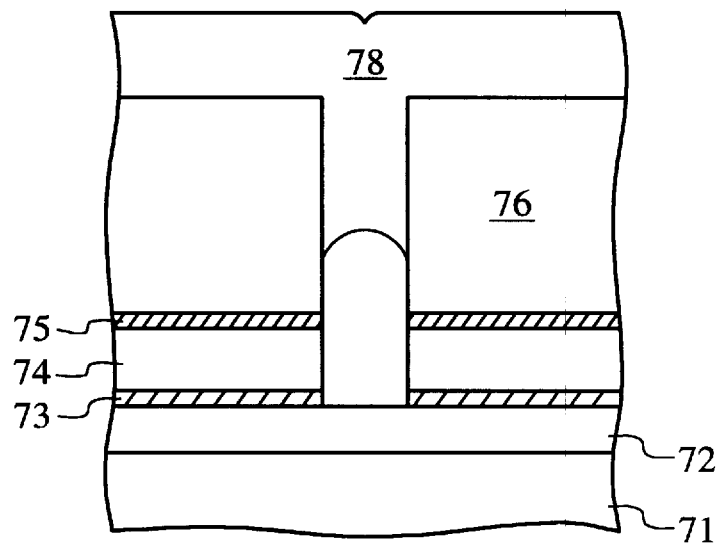

Next, as illustrated, in FIG. 7C, a rapid thermal annealing is carried out at 400° C. for 30 seconds. Under this condition, because of the reaction of layers in the lower electrode, an alloy is created (MoAlSi). This alloy causes lower layer 79 to expand in volume and fill the contact hole. The depth of the hole is reduced, thereby reducing the aspect ratio of the contact hole.

To complete the formation of the contact plug, aluminum is deposited (see FIG. 7D) by applying the cold-hot deposition method to form upper wiring layer 78 as is done in prior art techniques.

A third embodiment of the present invention is illustrated in FIGS. 8A–8E. This third embodiment is also applicable to cases where the diameter of the contact hole is small and the depth of the contact hole is deep. In this embodiment, an alloying compound is formed through the reactions between a lower layer and an upper layer deposited in the contact hole. Consequently, the aspect ratio is again reduced, and a plug can be formed therein.

Specifically, this method is carried out in the following manner. First, as illustrated, in FIG. 8A, a first insulating layer 82 composed of an oxide is formed upon substrate 81, and then, a lower wiring layer 91 is formed thereupon. This lower wiring layer is formed by depositing a 500A layer of Ti 83, a 5000A layer of Al 84 on Ti layer 83, a 500A layer TiN 85 on Al layer 84, and finally a 500A layer Ti 86 in the aforementioned sequence.

Figure 8A:
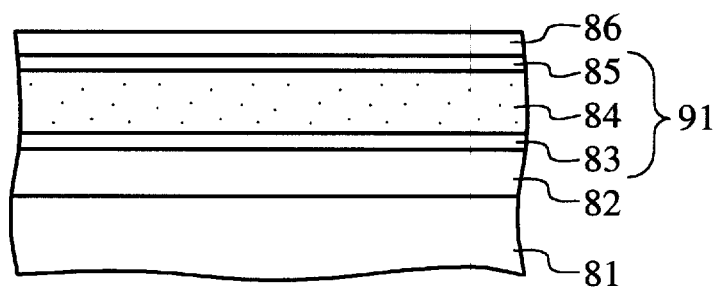
FIGS. 8A–8E are partial sectional views illustrating a third embodiment of the present invention.
Figure 8B:
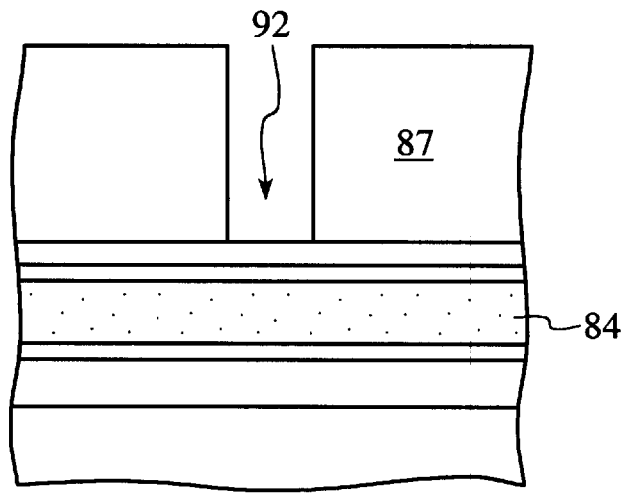
Figure 8C:
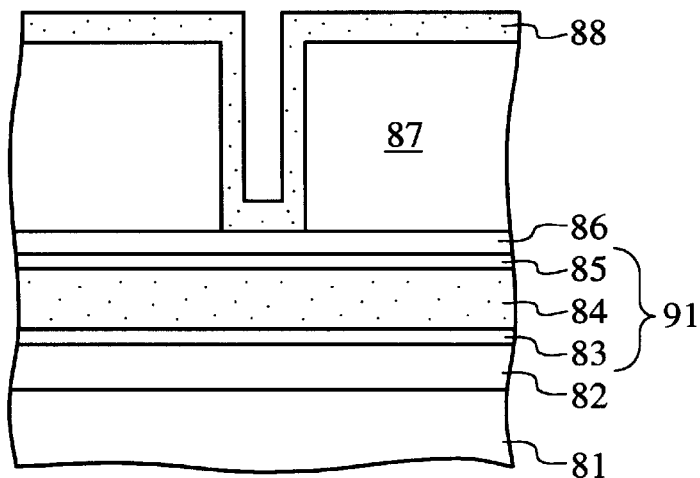

Next, as illustrated in FIG. 8B, a second insulating layer 87 is formed upon lower wiring layer 91. This second insulating layer 87 is selectively etched to form contact hole 92. As illustrated in FIG. 8C, a further aluminum layer 88 of about 1000A is formed on second insulating layer 87, contact hole 92, and lower wiring layer 91.

Figure 8D:
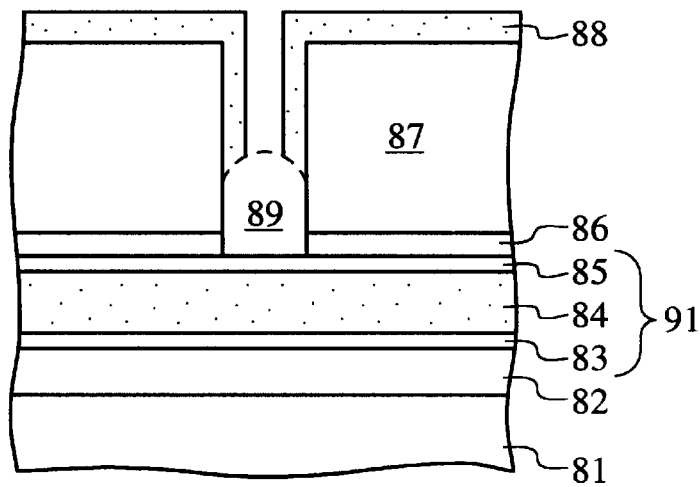

In FIG. 8D, a graphical depiction of the result of a rapid thermal annealing (carried out at 400° C. for 30 seconds) can be seen, including the fact that TiAl3 layer 89 is formed on the lower bottom portion of the contact hole as a result of an alloy reaction between deposited Al layer 88 and lower wiring layer 91. Consequently, a volume expansion occurs, and the lower portion of the contact hole is filled, resulting in a reduction of the aspect ratio.

Figure 8E:
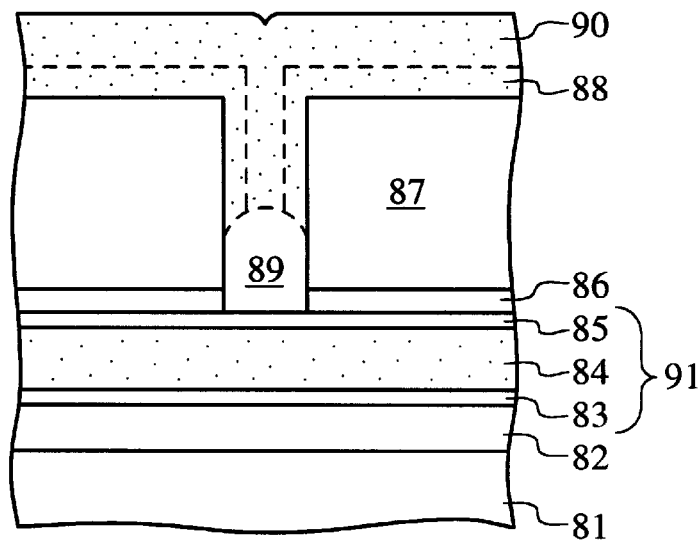

Finally, as illustrated in FIG. 8E, aluminum is deposited at a high temperature of over 500° C. so as to form upper wiring layer 90. Under this condition, a flowing of Al occurs to sufficiently fill the contact hole, with the result that there is formed a plug to connect the lower wiring layer 91 and the upper wiring layer 90 together.

As described above, in carrying out the present invention, a metal which undergoes an alloying reaction with Al is used to form the contact hole plug. This metal (or metals) is selected by one or more from a group consisting of Co, Cr, Mo, Ta, Ti and W.

According to the present invention as described above, even in the case where the aspect ratio of the contact hole or via hole is too large to make it possible to fill the hole and to form a plug using a prior art technique the present invention can be used to reduce the aspect ratio of the hole through the self reaction of the lower conductive layer. Therefore, even in the case of a contact hole with a large aspect ratio as required in a VLSI, the plug can be successfully formed.

What is claimed:

1. A method of reducing an aspect ratio of a contact hole in an insulating layer of a semiconductor device, comprising the steps of:

(1) forming a lower wiring layer consisting of a multi-layer metal structure;

(2) forming said insulating layer on said lower wiring layer;

(3) forming said contact hole through said insulating layer and exposing a region of the lower wiring layer; and (4) carrying out a rapid thermal anneal heat treatment, wherein the multi-layer metal structure of the lower wiring layer is formed of materials such that an alloying reaction occurs as a result of said heat treatment, wherein as a result of the alloying reaction said lower wiring layer expands upward into the contact hole, wherein the aspect ratio of the contact hole is reduced.

2. The method of claim 1, wherein said lower wiring layer expands and substantially fills said contact hole to form a contact hole plug.

3. The method of claim 1, further comprising a step after step (3) and before step (4) of forming an aluminum layer in said contact hole so that a contact hole plug is created which includes an alloy created from a reaction of said lower wiring layer and the aluminum layer.

4. The method of claim 1, wherein the multi-layer metal structure comprises a metal silicide layer, a metal layer, and a metal silicide layer.

5. The method of claim 1, wherein the multi-layer metal structure comprises a metal layer, a metal nitride layer, an aluminum layer, and a metal nitride layer.

6. The method of claim 4, wherein the metal of said metal silicide comprises a material selected from a group consisting of Co, Cr, Mo, Ta, Ti and W.

7. The method of claim 5, wherein the metal of said metal layer and said metal nitride layers comprises a material selected from a group consisting of Co, Cr, Mo, Ta, Ti and W.

8. The method of claim 2, wherein said lower wiring layer comprises aluminum.

9. The method of claim 1, wherein said heat treatment of step (4) comprises a rapid thermal annealing carried out at 300°–600° C. for several seconds to one minute.

10. The method of claim 8, wherein said heat treatment is carried out at 400° C. for 30 seconds.

11. The method of claim 2, further comprising the step of forming an upper wiring layer covering the contact hole, the contact plug and portions of said insulating layer.

12. The method of claim 3, further comprising the step of forming an upper wiring layer covering the contact hole, the contact plug and portions of said insulating layer.

13. A method of forming a contact hole plug through an insulating layer located on a semiconductor device, comprising the steps of:
   (1) forming a lower wiring layer consisting of a multi-layer conductive structure on said device, including at least one aluminum layer and a contiguous metal layer;
   (2) forming said insulating layer over said lower wiring layer;
   (3) forming said contact hole through said insulating layer and exposing a region of the lower wiring layer; and
   (4) performing a rapid thermal anneal, wherein, after the raid thermal anneal, the aluminum layer and metal layer of the lower wiring layer in the contact hole region reacts and forms an alloy that expands upward into said contact hole and substantially fills said contact hole, wherein the aspect ratio of the contact hole is reduced.

14. The method of claim 13, wherein the alloy expands and fills said contact hole in a direction extending from a bottom of said contact hole to a top of said hole.

15. The method of claim 13, wherein the multi-layer metal structure comprises a metal silicide layer, an aluminum layer, and a metal silicide layer.

16. The method of claim 13, wherein the multi-layer metal structure comprises a first metal layer, a metal nitride layer, an aluminum layer, and a second metal layer.

17. A method of forming a contact hole plug comprising the steps of:
   forming a first insulating layer on a substrate;
   forming a first conductive layer on the first insulating layer;
   forming a second conductive layer on the first conductive layer;
   forming a second insulating layer on the second conductive layer;
   forming a contact hole through the second insulating layer and exposing a region of the second conductive layer;
   forming a third conductive layer including in the contact hole and on the exposed region of the second conductive layer;
   performing a rapid thermal anneal, wherein the third conductive layer and the second conductive layer react with each other and form an alloy that expands upward to form the contact hole plug in the contact hole.

18. The method of claim 17, wherein the first conductive layer comprises a metal layer including a TiN layer at an upper portion thereof.

19. The method of claim 18, wherein the first conductive layer comprises a Ti layer, an aluminum layer and the TiN layer.

20. The method of claim 17, wherein the second conductive layer comprises Ti.

21. The method of claim 17, wherein the third conductive layer comprises aluminum.

22. The method of claim 17, wherein the rapid thermal anneal is carried out at 300°–600° C. for several seconds to one minute.

23. The method of claim 22, wherein the rapid thermal anneal is carried out at 400° C. for 30 seconds.

24. The method of claim 17, further comprising the steps of forming an Al layer covering the contact hole, the contact plug and portions of the second insulating layer.

25. The method of claim 20, wherein the contact plug comprises a TiAl3 layer formed on a lower bottom portion of the contact hole as a result of an alloy reaction between the second conductive layer and the third conductive layer.

26. The method of claim 21, wherein the contact plug comprises a TiAl3 layer formed on a lower bottom portion of the contact hole as a result of an alloy reaction between the second conductive layer and the third conductive layer.

* * * * *

UNITED STATES PATENT AND TRADEMARK OFFICE
CERTIFICATE OF CORRECTION

PATENT NO.  : 5,824,597
DATED       : October 20, 1998
INVENTOR(S) : Jeonge Hong It is certified that error appears in the above-identified patent and that said Letters Patent is hereby corrected as shown below:

Column 7, line 16, "raid" should be--rapid--.

Signed and Sealed this

Thirtieth Day of March, 1999

Attest:

Attesting Officer

Q. TODD DICKINSON

Acting Commissioner of Patents and Trademarks